United States Patent
Hsia et al.

(10) Patent No.: US 6,381,550 B1
(45) Date of Patent: Apr. 30, 2002

(54) METHOD OF UTILIZING FAST CHIP ERASE TO SCREEN ENDURANCE REJECTS

(75) Inventors: Edward Hsia, Saratoga; Phuong K. Banh, Sunnyvale; Darlene Hamilton, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/322,195

(22) Filed: May 28, 1999

(51) Int. Cl.$^7$ .............................................. G01N 37/00
(52) U.S. Cl. .................................. 702/82; 365/185.11
(58) Field of Search ........................... 702/62, 82, 108, 702/109, 157, 186; 365/185.11, 185.22, 185.29, 185.31

(56) References Cited

U.S. PATENT DOCUMENTS 6,055,184 A * 4/2000 Acharya et al. ....... 365/185.11

* cited by examiner

Primary Examiner—John S. Hilten
Assistant Examiner—John Le
(74) Attorney, Agent, or Firm—H. Donald Nelson

(57) ABSTRACT

A method of utilizing Fast Chip Erase to screen endurance rejects. Multiple sectors in a device are selected and a time necessary to program all cells in the sectors is monitored and if the monitored time exceeds a first time, the device fails. A time necessary to erase all the cells without any over-erased cells is monitored and if the time exceeds a second time, the device fails. A time necessary to correct overerased cells is monitored and if the time exceeds a third time, the device fails. The total time from erase until overerase correction is achieved is monitored and if the total time exceeds a fourth time, the device fails. The total time to determine erasability is monitored and if this time exceeds a fifth time, the device fails.

9 Claims, 3 Drawing Sheets

METHOD OF UTILIZING FAST CHIP ERASE TO SCREEN ENDURANCE REJECTS

BACKGROUND OF THE INVENTION

1. Field of the Invention

This invention relates generally to the testing of Flash memory devices, and more particularly, to a test method to screen endurance rejects. Even more particularly, this invention relates to an erasability test method for a device that allows for the erase of multiple sectors of the device simultaneously during the erasability test.

2. Discussion of the Related Art

The standard test method used for Flash memory devices includes testing at the wafer level and testing after each individual die has been packaged. The wafer level testing is commonly done at room temperature and is called wafer sort. The package level testing is done after the wafer has been sawed into single chips and after each chip that has passed the wafer sort has been encapsulated in a package, which is typically plastic. The package level testing is commonly called final test or class test and is done at an elevated temperature, usually at a temperature selected from the range of 70 to 135° C. Once the package level or class test is complete the Flash memory devices that pass the class test are marked appropriately and shipped to a customer.

The wafer sort is used to remove or screen-out the chips that have a defect or defects that occur during the fabrication of the wafer. The wafer sort is used to ensure that only those chips that have a possibility of being shipped to a customer are encapsulated in a package. This is done to control the packaging cost since bad chips are not packaged.

Presently, the class testing, also known as backend testing, is still necessary since the wafer sort is done at room temperature and some of the chips are sensitive to operations at elevated temperatures. The operations that are most sensitive to elevated temperatures are speed sorting (a sort that determines the speed of the Flash memory device), programmability, and certain low level leakage current testing. Other tests that are conducted during the backend testing are dc parametric tests, ac functionality and erasability. After the erasability tests are conducted, the dc parametrics and ac functionality are rechecked. Of course, a part of the backend testing is to ensure that the encapsulation (packaging) process did not damage the die.

A programming operation changes the logic state of a cell from a "1" (called "blank") to a logic "0" (called "programmed"). A read operation detects the state of the cell, that is, whether the cell is in a blank state or in a programmed state. The programming and read operations are done at the byte level and/or word level, that is 8 cells (bits) at a time, and/or 16 cells (bits) at a time, on a Flash memory device. The erase operation is an operation that changes the state of a cell to a "1" or blank state. The erase operation is done on all cells in the array or sector of an array at the same time. To prevent "over-erasure" of an individual cell, all cells must be programmed to a logic "0" before the erase operation. Overerasure of a cell can cause problems during subsequent programming and read operations and in some cases would prevent the cell from being programmed. The typical Flash memory device must have all cells at a logic "1" when transferred to the class testing or when shipped to a customer. This means that if any cell is read as programmed, that is, read at a logic "0" then all cells must be programmed to a logic "0", read, erased, and reread to ensure all cells are blank, that is, are at a logic "1".

One of the problems encountered in the Flash memory art is that the cells are not exactly the same, that is, some cells either program or erase faster or slower than other cells. It is necessary, therefore, to provide a series of programming pulses or erase pulses to a device to ensure that all cells have substantially the same amount of charge (or lack of charge) on the floating gate. The key to a good device is that all cells in the device can be programmed or erased by being subjected to a series of program pulses or erase pulses with the number of pulses being within an acceptable range.

The wafer sort and backend (class) tests require lengthy test sequences due to the large number of memory cells that need to be read, programmed, read again, erased, and read again. The number of cells in a Flash memory device commonly exceeds 1–2 million cells and it is expected that this number will continue to increase.

Presently the art of production test methods for testing involve the usage of Sector Erase (SE) to screen out endurance related rejects and is based upon what a typical customer would do. Through monitoring the amount of time used during preprogramming, erase, and compensating for slightly overerased cells at a predetermined voltage in the SE mode, units that exceed predetermined time limits are rejected in volume production testing. Those units that are programmed or erased within the predetermined time limits are considered saleable to customers. The method of determining the time limits is by an initial characterization of the device. The SE method of screening endurance-related rejects utilizes a mode wherein the erasability testing is limited to a single sector of the Flash memory device at a time. Being limited to testing a single sector at a time extends the testing time and represents a substantial portion of the costs associated with the manufacturing of Flash memory devices. In order to remain competitive, flash memory device manufacturers must decrease the cost of manufacturing in any way possible.

Therefore, what is needed is a method of testing that decreases the time needed to accurately screen endurance-related rejects in Flash memory devices utilizing a mode wherein multiple sectors in the Flash memory device can be tested simultaneously.

SUMMARY OF THE INVENTION

According to the present invention, the foregoing and other objects and advantages are attained by a method of utilizing Fast Chip Erase to screen endurance rejects during testing of a Flash memory device. Multiple sectors of the Flash memory device are selected and it is determined if all the cells in the multiple sectors are programmed. If all the cells in the multiple sectors are not programmed, the unprogrammed cells are programmed and the time to complete this operation is monitored and if the time exceeds a first predetermined time the testing is terminated.

In accordance with an aspect of the invention, all the cells in the multiple sectors are erased and the time necessary to erase all the cells without having any overerased cells is monitored and if the time exceeds a second predetermined time the testing is terminated.

In accordance with another aspect of the invention, overerased cells in the multiple sectors are corrected when they are detected and the time to correct for overerased cells is monitored and if the time exceeds a third predetermined time the testing is terminated.

In accordance with still another aspect of the invention, the total time after the application of erase pulses to the cells until the cells are overerase corrected is monitored and if this time exceeds a fourth predetermined time the testing is terminated.

In accordance with another aspect of the invention, the testing on the multiple sectors is finished when all the cells are erased and the total time for determining the erasability of the Flash memory device is monitored and if this time exceeds a fifth predetermined time, the testing is terminated.

In accordance with another aspect of the invention, this procedure repeats until all sectors in the Flash memory device have been tested.

In accordance with another aspect of the invention, the first through the fifth predetermined times are determined during an initial characterization of the Flash memory device.

The described method of utilizing Fast Chip Erase to screen endurance rejects during testing of a Flash memory device thus provides an accurate method to test multiple sectors of the Flash memory device simultaneously and thereby decreases total testing time. This results in substantial savings in manufacturing and testing costs.

The present invention is better understood upon consideration of the detailed description below, in conjunction with the accompanying drawings. As will become readily apparent to those skilled in the art from the following description, there is shown and an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1A:
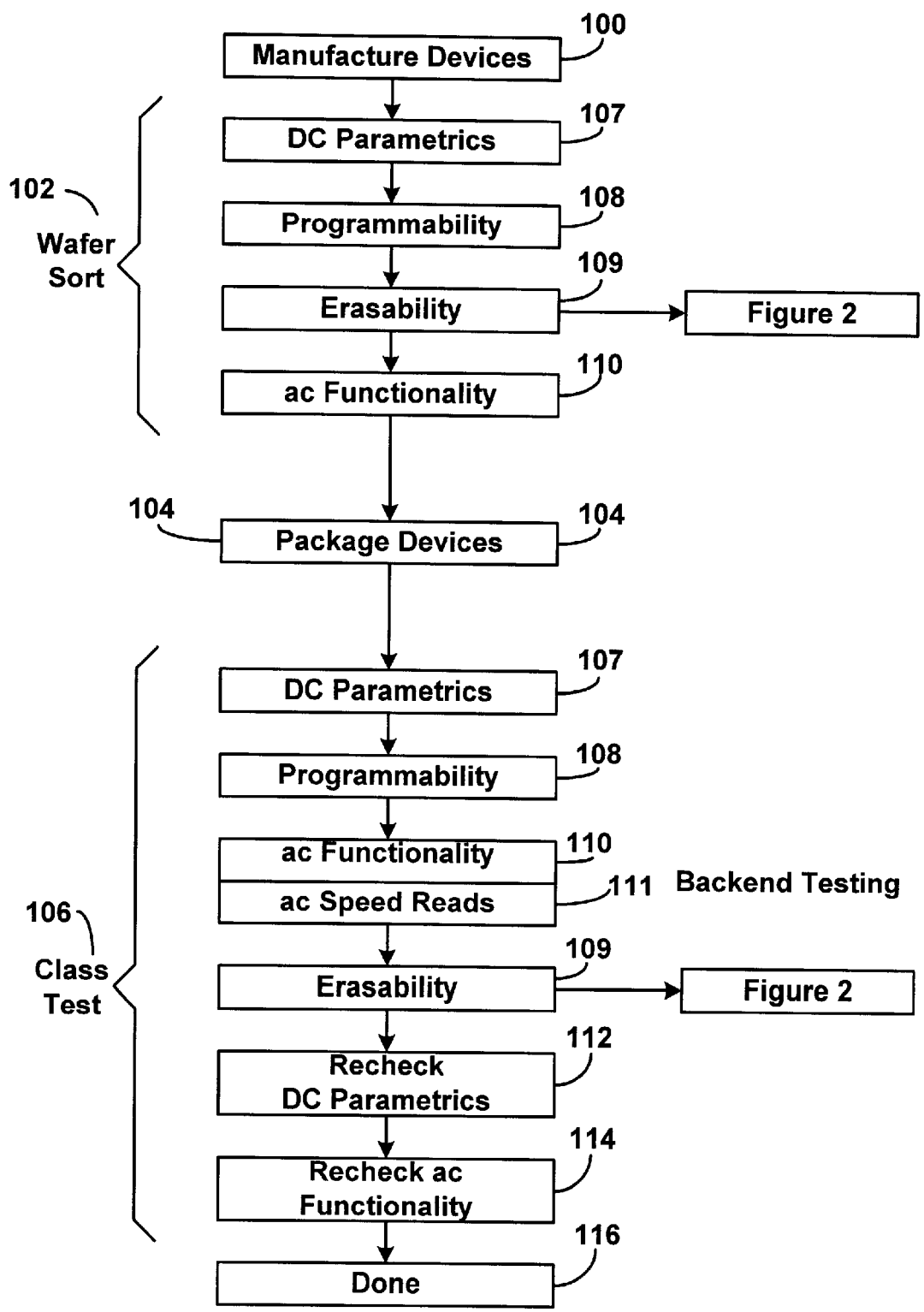
FIG. 1A is a flow diagram showing the tests conducted during testing of Flash memory devices.

FIG. 1A is a flow diagram of the current tests that are conducted after the manufacture of Flash memory devices. The Flash memory devices are manufactured as indicated at 100. The Flash memory devices are manufactured in and on a wafer, which is subjected to tests that are known as wafer sort tests 102 and the Flash memory devices that do not pass any of the wafer sort tests are rejected. The Flash memory devices that pass the wafer sort tests are packaged, as indicated at 104. The packaged Flash memory devices are then subjected to a series of tests known as backend testing or class testing 106. The class testing includes some of the same tests that were conducted in the wafer sort tests. The tests that are repeated in the class tests are referred to with like numerals. The common tests include dc parametric tests 107, which include testing for dc continuity, shorts, leakage current tests, etc. The next common test is a programmability test 108 that tests the Flash memory device for programmability. The next common test is erasability test 109 that tests the Flash memory device for erasability. The next common test is the ac functionality test 110 that subjects the Flash memory devices to various ac tests.

In addition to the above tests conducted in both the wafer sort tests 102 there is an ac speed read test 111 conducted during the class test that determines the speed of the Flash memory devices. After the erasability test 109 is conducted in the class tests of the Flash memory, the dc parametrics of the Flash memory devices are rechecked at 112 and the ac functionality of the Flash memory devices is rechecked at 114. The Flash memory devices that pass all of the above tests are then considered done as indicated at 116 and are offered for sale to a customer.

Figure 1B:
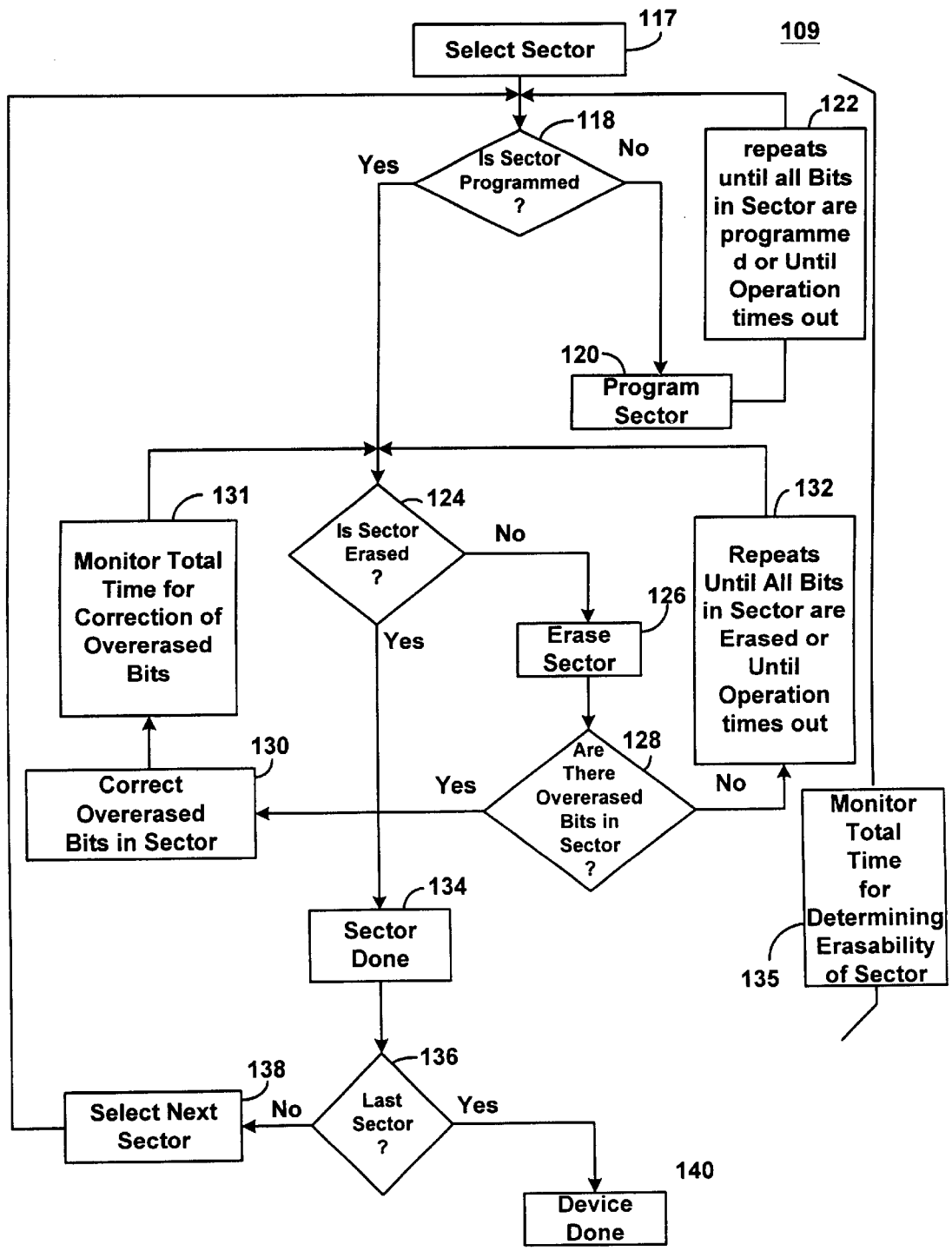
FIG. 1B is a flow diagram showing how erasability tests of Flash memory devices are conducting in the prior art.

FIG. 1B is a flow diagram showing how erasability tests 109 of Flash memory devices are conducted in the prior art. As is known in the art, the erasability tests 109 may be accomplished by an algorithm embedded in the Flash memory device. The embedded erase algorithm functions basically as follows. A sector of cells in the Flash memory device is selected by the algorithm to be tested for erasability, as indicated at 117. As is further known in the Flash memory art, Flash memory devices are typically divided into sectors that can be programmed, read and erased separately from the other sectors. As is also known in the Flash memory art, each cell in each sector can be programmed and read individually, by bytes or words, but all cells in a sector must be erased simultaneously.

It is then determined at 118 by the embedded erase algorithm if all of the cells in the sector are programmed. The embedded erase algorithm monitors various states of the device and the various elapsed times, as will be discussed below, by monitoring various status bits in the Flash memory device. If the cells are not all programmed, the unprogrammed cells are programmed at 120 by providing the unprogrammed cells with the appropriate programming voltages and a programming pulse. The appropriate programming voltages are voltages that are applied to each gate and drain of the cells in the sector and a programming voltage applied to the cells being programmed. The various methods and voltages for the programming of flash memory cells (bits) are well known in the art and will not be further discussed. After the unprogrammed cells are programmed, the flow returns to 118 where it is again determined if the cells in the sector are all programmed. If not, the unprogrammed cells are again programmed at 120. This cycle repeats until all of the cells indicate as being programmed or until there is a time out as indicated at 122. The time out period is a predetermined time that is determined by an initial characterization of the Flash memory device. If there is a time out, it is indicative that the Flash memory device either cannot be programmed or that a customer could not program the Flash memory device in a reasonable amount of time.

If it is determined at 118 that the cells in the sector are all programmed, the embedded erase algorithm then determines at 124 if all of the cells in the sector have been erased. If it is determined at 124 that the cells in the sector have not all been erased, the cells are erased at 126 by providing all of the cells in the sector with the appropriate erase voltages and an erasure pulse. The various methods of erasing a flash memory device are well known in the art and will not be further discussed. After all of the cells in the sector have been given an erase pulse at 126 it is determined at 128 if there are any overerased cells in the sector. As is known in the flash memory art, overerased cells will cause faulty results when the Flash memory devices are either programmed in a subsequent programming operation or during a subsequent read operation. If there are overerased cells in the sector, the overerased cells are corrected automatically by the embedded erase algorithm at 130. The embedded algorithm corrects the overerased cells by providing what is known as a "soft" programming pulse to the overerased cells. The goal of this step is to bring all of the cells to the same level of being "programmed" or of being "erased," that is, that all of the cells in the sector have the same or substantially the same threshold voltage. After overerase correction action at 130, the flow returns to 124 where it is again determined if all of the cells in the sector are erased. The embedded erase algorithm monitors the time for correction of overerased cells, as indicated at 131. If the time monitored at 131 exceeds a predetermined time the erase operation times out and the Flash memory device is considered as having failed. The predetermined time out period is a time determined by an initial characterization of the Flash memory device.

If the embedded algorithm determines at 128 that there are no overerased cells in the sector, the flow returns to 124 where it is again determined if all of the cells in the sector are erased. This cycle repeats, as indicated at 132 until all of the cells in the sector indicate being erased or the operation times out. The time out period is a predetermined time that is determined by an initial characterization of the Flash memory device. If there is a time out, it is indicative that the Flash memory device either cannot be erased completely or that it would take an unreasonable amount of time to erase the Flash memory device. As can be appreciated, the value of a Flash memory device is the ability to erase and reprogram the Flash memory device at will up to 100,000 times. If it is impossible or difficult to completely erase the Flash memory device, it cannot be reprogrammed accurately and it is then useless to the end user. In addition, it is usual for a Flash memory device to be delivered to the end user in a completely erased state.

If it is determined at 124 that the cells in the sector are all erased, the sector is considered as having passed the erasability tests as indicated at 134. The total time for determining the erasability of the sector is monitored as indicated at 135. The embedded erase algorithm determines, at 136, if the sector just completed is the last sector. If the sector just completed is not the last sector, the embedded erase algorithm selects the next sector, at 138, and the flow returns to 118 and the above process repeats until the embedded erase algorithm determines, at 136, that the sector just completed is the last sector. If the sector just completed is the last sector in the Flash memory device, the Flash memory device is then considered done, as indicated at 140.

Figure 2:
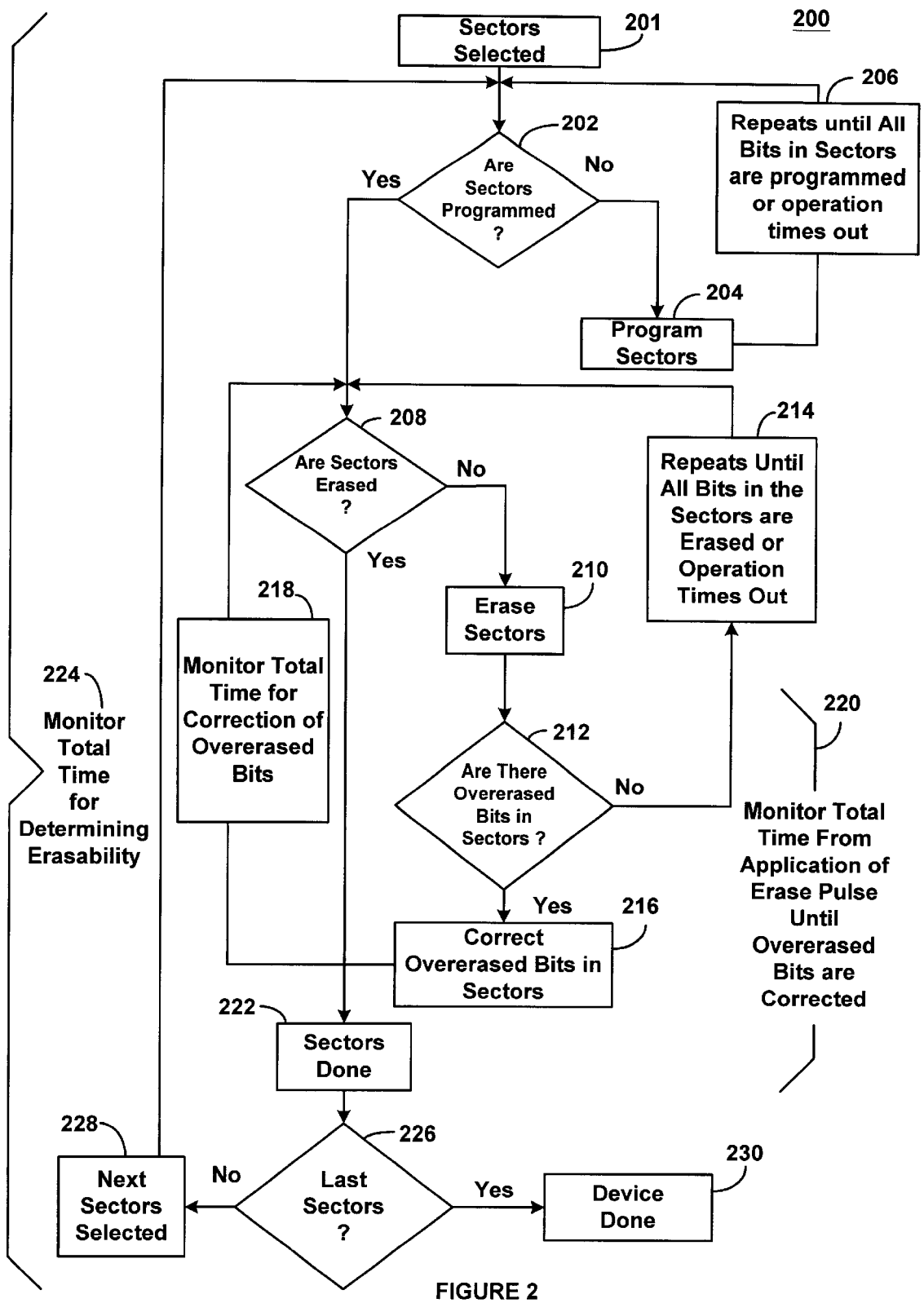
FIG. 2 is a flow diagram showing how erasability tests of Flash memory devices are conducted in accordance with the present invention.

Referring now to FIG. 2, there is shown a flow diagram of the method the embedded erase algorithm performs erasability tests of Flash memory devices in accordance with the present invention. The flow diagram shown in FIG. 2 is similar to the flow diagram in FIG. 1 with the exception that the method of the present invention allows multiple sectors of a Flash memory device to be subjected to erasability testing simultaneously.

The flow diagram shown in FIG. 2 is known as a Fast Chip Erase (FCE) and is a special test mode that can be implemented by an embedded erase algorithm in all low voltage Flash products, including those having 0.8 $\mu$m and smaller process technology. The advantage of the FCE mode over that of the SE mode is that the FCE mode allows the erasure of multiple sectors simultaneously as opposed to a single sector at a time by the SE mode. As can be appreciated, the substitution of the FCE mode for the SE mode during volume production testing translates into significant test time reduction. This test time reduction translates into reduced manufacturing cost and improved manufacturing efficiency. As will be appreciated, the significant differences between the FCE mode and the SE mode require careful monitoring of the specific time limits used for preprogramming, erase and compensating for slightly overerased cells. The inventors have determined that if there is not a direct correlation, the quality and reliability of devices shipped to customers is questionable.

The inventors made extensive comparisons between devices subjected to the SE mode and devices that were subjected to the FCE mode in order to obtain significant valid statistical correlation data. The comparisons were done using large quantities of production units that either passed or failed the SE mode tests. The passing and rejected units were characterized for their programming and erase characteristics through an engineering program. The amount of time used at varying voltages for passing and rejected units during pre-programming, erase, and compensating for slightly overerased cells were collected for both FCE and SE modes. An additional key parameter of monitoring the amount of time used during compensating for slightly overerased cells between consecutive erase pulses was discovered to be essential to the success of establishing a direct correlation of the FCE and the SE modes. By comparing the averages and standard deviations of these time limits, a direct correlation between the FCE and SE modes was determined.

Massive correlation data over a large quantity of production units confirmed that a test time reduction of over 30% was realized without sacrificing quality and reliability of Flash memory devices that were delivered to customers. Thus, a test method using FCE has been discovered and it has been proven that it can be used in a production environment as will be described below. The FCE replaces the prior art method of testing using SE to screen out endurance related rejects. The FCE mode is applicable to any Flash memory device that has similar circuitry.

It should be appreciated that the FCE method of testing Flash memory devices can be implemented in either the wafer sort tests or in the class tests. It should also be appreciated that the description below describes the FCE method as implemented by an embedded erase algorithm. The present invention is not to be limited to an implementation of an embedded erase program and it is intended that any implementation of the FCE is comprehended by the present invention.

Referring again to FIG. 2, the difference between the method shown in FIG. 1B and the method shown in FIG. 2 is that the erasability test method 200 in FIG. 2 replaces the erasability test method 109, FIG. 1B. A major advantage of the FCE mode over the SE mode is that multiple sectors can be tested simultaneously.

During the erasability tests 200 conducted by the embedded erase algorithm in the Flash memory device, the embedded erase algorithm determines at 202 if all of the cells in the multiple sectors in the Flash memory device being tested are programmed. If the cells in the multiple sectors are not all programmed, the device is programmed as indicated at 204 by providing the cells in the multiple sectors with the appropriate programming voltages and a programming pulse. The various methods of programming a flash memory device are well known in the art and will not be further discussed. The flow returns to 202 where it is again determined if all of the cells in the sector are programmed. If not, the device is again programmed at 204. This cycle repeats until either all the cells indicate as being programmed or until the operation times out as indicated at 206. The time out is a time period determined by an initial characterization of the device. If there is a time out, it is indicative that the device either cannot be programmed or that a customer could not program the device, if at all, in a reasonable amount of time.

If the embedded erase algorithm determines at 202 that all of the cells in the sectors are programmed, the next step is to determine at 208 if all the cells in the sectors have been erased. If the embedded erase algorithm determines at 208 that some of the cells in the sectors have not been erased, the cells in sectors are erased at 210 by providing all of the cells in the sectors with the appropriate erase voltages and an erase pulse. The various methods of erasing a flash memory device are well known in the art and will not be further discussed. After all of the cells in the sectors have been given an erase pulse at 210 the embedded erase algorithm determines at 212 if there are any overerased cells in the sectors. If there are no overerased cells in the sectors, the flow is returned to 208 where the embedded erase algorithm determines if the all of the cells in the sectors have been erased. This cycle repeats as indicated at 214 until all of the cells in the multiple sectors being tested are erased or the operation times out. The time out is a predetermined number that is determined by an initial characterization of the device. If there is a time out, it is indicative that the device either cannot be programmed or that a customer could not erase and reprogram the device in a reasonable amount of time.

If the embedded erase algorithm determines at 212 that there are overerased cells, the overerased cells are corrected, as indicated at 216. As is known in the flash memory art, overerased cells will cause faulty results when the devices are either programmed in a subsequent programming mode or during a subsequent read. The goal of this step is to bring all of the cells to substantially the same level of being "programmed" or of being "erased," that is, that all of the cells in the Flash memory device have the same or substantially the same threshold voltage. After the embedded erase algorithm corrects the overerased cells at 216 the flow returns to 208 where it is again determined if all of the cells in the multiple sectors being tested have been erased. The above-described flow repeats until all of the cells in the sectors indicate as being not overerased or if the operation times out, as indicated at 218. The time out is a predetermined number that is determined by an initial characterization of the device. In addition, the total time for correction of overerased cells and is measured from the time after an erase pulse is applied to the time after overerased cells have been corrected and is indicated at 220.

If the embedded erase algorithm determines at 208 that all of the cells in the sectors are erased, the testing of the multiple sectors is considered done, as indicated at 222. The total time measured from the time the device has been subjected to the erasability tests at 202 until the sectors have been erased at 222 is indicated at 224. If the embedded erase algorithm determines that the total time at 224 exceeds a predetermined time, the testing is terminated and the Flash memory device is considered to have failed. The total time 224 is the total time necessary to determining erasability until the entire Flash memory device is tested and is the time from element 210 to element 230.

After the sectors have been successfully erased at 222, the embedded erase algorithm determines at 226 whether the sectors just tested are the last sectors to be tested. If not, the embedded erase algorithm selects the next sectors to be tested at 228 and the flow returns to 202 and the above-described methodology repeats until all of the sectors have been tested. If the sectors just tested are the last sectors to be tested, the Flash memory device is finished as indicated at 230.

If any of the time monitors exceed the predetermined times established during the initial characterization for the device, the tests cease and the device is considered to have failed the test. It should be appreciated that devices could possibly pass these tests if the tests (programming, erase, reprogramming, etc.) were allowed to continue for a long period of time. However, the long-term endurance and the reliability of the device would be questionable and the sale of such marginal parts could and probably would destroy or seriously damage the credibility of the manufacturer who sold such parts.

In summary, the results and advantages of the fast chip embedded erase algorithm to screen endurance rejects during testing of a Flash memory device can now be more fully realized. The described method provides an accurate method to test multiple sectors of the Flash memory device simultaneously and thereby decreases total testing time. This results in substantial savings in manufacturing and testing costs.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of utilizing fast chip erase to screen endurance rejects during testing of a Flash memory device, wherein the Flash memory device is divided into multiple sectors, the method comprising:

(a) selecting at least two sectors from the multiple sectors;

(b) determining if all cells in the at least two sectors are programmed;

(c) programming the cells that are not programmed;

(d) repeating steps (b) and (c) until all cells in the at least two sectors are programmed or until a first predetermined time is exceeded at which time the testing of the Flash memory device is terminated;

(e) determining if all cells in the at least two sectors are erased when all cells in the at least two sectors are programmed;

(f) erasing all the cells in the at least two sectors if there are cells that are not erased in the at least two sectors;

(g) determining if there are overerased cells in the at least two sectors at the completion of step (f);

(h) go to step (e) until all cells in the at least two sectors are erased then go to step (i) or until a second predetermined time is exceeded at which time the testing of the Flash memory device is terminated;

(i) correcting overerased cells in the at least two sectors if overerased cells are detected during step (g);

(j) go to step (e) until the cells in the at least two sectors are erased with no overerased cells then go to step (k) or until a third predetermined time is exceeded at which time the testing of the Flash memory device is terminated; and (k) monitoring a total time from step (f) until the completion of step (i) and terminating the testing if the total time in this step (k) exceeds a fourth predetermined time.

2. The method of claim 1 further comprising:

(l) completing the testing on the at least two sectors if step (e) indicates that all cells in the at least two sectors are erased; and (m) monitoring a total time from step (a) to step (l) and terminating the testing if the total time in this step (m) exceeds a fifth predetermined time.

3. The method of claim 2 further comprising:

(n) determining if the at least two sectors just tested are the last sectors in the Flash memory device; and (o) selecting at least two next sectors to be tested and repeating steps (b) through (l).

4. The method of claim 3 further comprising:

(p) terminating the erasability testing on the Flash memory device when step (n) determines that the last sectors in the Flash memory device have been tested.

5. The method of claim 4 further comprising determining the first predetermined time during an initial characterization of the Flash memory device wherein the first predetermined time is the total time for step (d).

6. The method of claim 5 further comprising determining the second predetermined time during the initial characterization of the Flash memory device wherein the second predetermined time is the total time for step (h).

7. The method of claim 6 further comprising determining the third predetermined time during the initial characterization of the Flash memory device wherein the third predetermined time is the total time for step (j).

8. The method of claim 7 further comprising determining the fourth predetermined time during the initial characterization of the Flash memory device wherein the fourth predetermined time is the total time for step (k).

9. The method of claim 8 further comprising determining the fifth predetermined time during the initial characterization of the Flash memory device wherein the fifth predetermined time is the total time for step (m).

* * * * *